(12) United States Patent
Hwang

(10) Patent No.: US 7,268,077 B2
(45) Date of Patent: Sep. 11, 2007

(54) CARBON NANOTUBE REINFORCED METALLIC LAYER

(75) Inventor: Chi-Won Hwang, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/292,690

(22) Filed: Dec. 2, 2005

(65) Prior Publication Data

US 2007/0128883 A1    Jun. 7, 2007

(51) Int. Cl.
    *H01L 21/44* (2006.01)
(52) U.S. Cl. .............. 438/680; 438/676; 438/678; 438/679; 257/E21.006; 257/E21.17; 257/E51.04
(58) Field of Classification Search ............... 438/680, 438/681, 686, 676, 678, 679, 99, 105, 510, 438/513, 726, 728, 687, 688, 931
    See application file for complete search history.

(56) References Cited

U.S. PATENT DOCUMENTS

| 6,706,402 | B2 * | 3/2004 | Rueckes et al. | 428/408 |
| 6,982,519 | B2 * | 1/2006 | Guillorn et al. | 313/311 |
| 2005/0101112 | A1 * | 5/2005 | Rueckes et al. | 438/584 |
| 2005/0128788 | A1 * | 6/2005 | Segal et al. | 361/151 |
| 2005/0167655 | A1 * | 8/2005 | Furukawa et al. | 257/20 |
| 2005/0266627 | A1 * | 12/2005 | Furukawa et al. | 438/197 |
| 2006/0068107 | A1 * | 3/2006 | Madou et al. | 427/249.1 |

* cited by examiner

*Primary Examiner*—David Nhu
(74) *Attorney, Agent, or Firm*—Laleh Jalali

(57) ABSTRACT

A method and apparatus including an interconnect structure having a surface, a plurality of nanotubes disposed adjacent to the surface, and a metallic layer disposed adjacent to the surface and substantially including the nanotubes. An assembly may include a first embodiment of an apparatus as described, and may further include a second such embodiment at least one of physically and electrically coupled to the first embodiment.

13 Claims, 6 Drawing Sheets

CARBON NANOTUBE REINFORCED METALLIC LAYER

FIELD OF THE INVENTION

The present invention relates generally to the field of semiconductor manufacturing. In particular, the present invention relates to the reinforcement of metallic layers.

BACKGROUND OF THE INVENTION

Semiconductor devices, for example, microprocessors and chipsets, typically include a large number of terminals for supplying power, and for providing for input and output of electrical signals. Such terminals may be provided in an array on a surface of a device, which, when placed adjacent to and physically coupled to a corresponding array of terminals on a circuit substrate, such as a printed circuit board, may provide for conveyance of electrical signals between the device and other devices or power planes on the circuit substrate. The general trend in the industry is toward semiconductor devices operating at higher speeds and handling a greater number of signals, which has led to a corresponding trend toward designing an increasing number of power and I/O signal terminals into semiconductor devices. Simultaneously, semiconductor device manufacturers strive to contain the growth in the size of semiconductor devices, or even reduce them in size, to produce mobile electronic devices such as cellular phones, notebook computers, and digital media players. Therefore, in many instances, an increased number of terminals on a smaller or only nominally larger semiconductor device results in an increased density of terminals on a surface of the semiconductor device.

Some methods for meeting the design challenges of highly dense terminal arrays include shrinking the size of each terminal, and decreasing the pitch between adjacent terminals in an array. In some cases, ultra fine pitch terminal arrays may be formed. One of the challenges presented by such ultra fine pitch terminal arrays is that of forming reliable bonds between the terminals of a semiconductor device and a circuit substrate with the limited amounts of materials that may included as part of each terminal, without forming detrimental conductive bridging between adjacent terminals on either the semiconductor device or the circuit substrate. Electrolytic and chemical solder plating have been intensively studied in the electronics and semiconductor industries due to the low costs and relatively simple process involved. A few micrometers of plated solder on, for example, a metal bump or pad, can be produced using these plating techniques to provide an interconnection material for joining a terminal of a semiconductor device to that of a circuit substrate.

A short time after joining terminals, however, the relatively fast interdiffusion of elements of the metal bump and the plated solder, or of the pad and the plated solder, create a layer of 'intermetallic compounds' (IMC) at the bond line between the bump and the pad. IMC layers may be very brittle, and are recognized as a primary cause of joint failures when internal or external stress is applied to the bond. Examples of stresses commonly encountered include thermal stresses caused by differing coefficients of thermal expansion when the materials involved are exposed to thermal differentials during manufacturing or use, or physical stresses resulting from mechanical assembly processes and shipping and handling. Such stresses may be aggravated by poor coplanarity of terminals in an array of terminals.

Joint failures may include cracks propagating across a bond line and forming an 'open' circuit whereby a signal may be unable to travel across an air gap formed between the bump and the pad by the crack. In other cases, a crack across a bond line may result in the circuit being sometimes open and sometimes closed as the thermal, physical, or other conditions of a device change during use. In either case, the result may be at best an unreliably performing device, and at worst, a completely inoperative device. Attempts to resolve such reliability problems include such things as the use of an anisotropic conductive adhesive material. However, problems inherent in this approach include poor electrical performance due to water absorption and oxygen permeation, low impact strength due to high filler content, poor adhesion to copper, and poor long-term reliability performance.

Presently, the successful implementation of fine-pitch terminal arrays in semiconductor products, including the reliability of bonds formed with terminals, remains a substantial challenge.

DETAILED DESCRIPTION OF THE INVENTION

Figure 1:
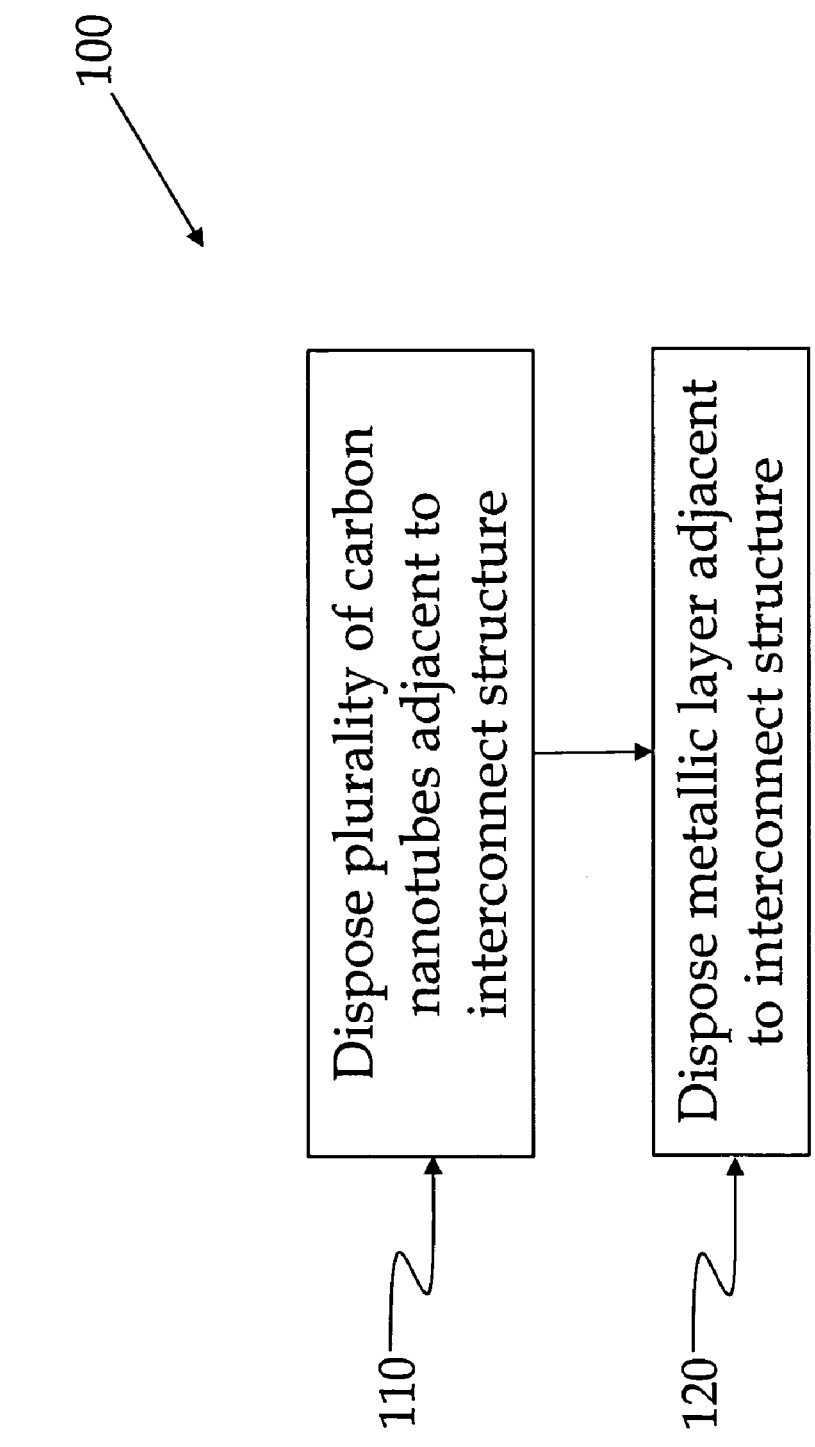
FIG. 1 depicts a block diagram of a method of reinforcing a metallic layer with carbon nanotubes according to an embodiment of the invention.

Referring to FIG. 1, an embodiment of a method, 100, for reinforcing a metallic layer may include disposing a plurality of carbon nanotubes (hereinafter referred to as 'nanotubes' for simplicity) adjacent to an interconnect structure, at 110. In embodiments, nanotubes may include single-walled nanotubes, multi-walled nanotubes, or a combination of single-walled nanotubes and multi-walled nanotubes. Numerous approaches for disposing a plurality of nanotubes will be described later according to embodiments.

Figure 3:
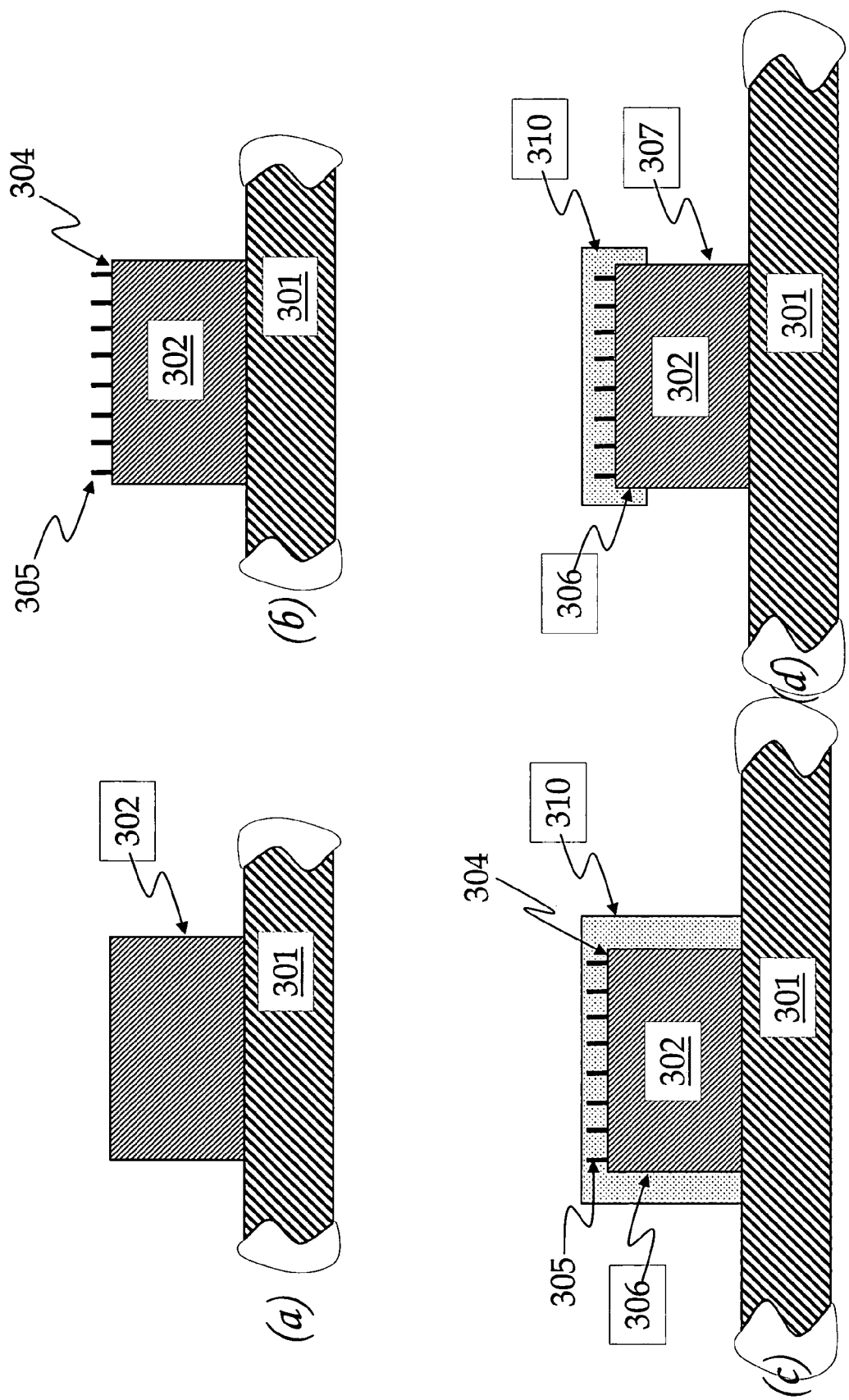
FIGS. 3a-3d depict cross-sectional views of an interconnect structure wherein nanotubes and a metallic layer are disposed adjacent to the interconnect structure according to embodiments of the invention.

As may be seen in FIG. 3a, an interconnect structure 302 may be disposed adjacent to a substrate 301. BGA package substrates, printed circuit boards (PCBs), flex substrates, and even semiconductor devices, for example, as part of a flip chip package or 'stacked' package, may all be considered substrates 301 according to exemplary embodiments of the invention. A substrate 301 may include any circuit substrate, including integrated circuit substrates (e.g., a silicon or other wafer, or portion thereof) and printed circuit substrates (e.g. organic, ceramic, vitreous, solid state, or others) according to embodiments, or more generally, a substrate 301 may be any structure having a surface adjacent to which an interconnect structure 302 may be disposed, or may be physically, electrically, or thermally coupled.

An interconnect structure 302, according to embodiments, may be a structure capable of being coupled to another structure, either electrically, physically, or both. Such structures are termed 'interconnect structures' herein, but may also commonly be referred to simply as 'interconnects'. Exemplary embodiments of an interconnect structure 302 may include a solder bump, a solder ball, a wire, a microvia, or a solder pad. Other bumps, balls, wires, vias, or pads may also be used, as the invention is not so limited. For example, in addition to microvias, embodiments may include larger scale vias, through vias, blind vias, via-in-pad structures, and others. Likewise, the invention is not limited to bumps, pads, wires, vias and balls, as other interconnect structures 302 may likewise be used without departing from the spirit of the invention. For example, embodiments of the invention may include as interconnect structure the terminals of passive devices, such as capacitors, resistors, inductors, or others as are known in the art. For simplicity of description, the interconnect structures of such passive devices are included in this description as at least one of bumps, pads, wires, vias, or balls. Likewise, the terminals of a lead frame in a lead frame device may also be included as interconnect structures in embodiments of the invention, and be included in the described bumps, pads, wires, vias, or balls. A controlled collapse chip connect (C4) interconnect may be considered at least one of a bump or a ball. However, the foregoing examples are only illustrative, and are not limiting with respect to embodiments of the invention. It should be understood as within the scope of the invention that any component or device having an interconnect structure disposed adjacent to a surface, wherein the interconnect structure may be at least one of physically or electrically coupled to another interconnect structure disposed adjacent to the surface of a substrate or of another device, may be within the scope of embodiments of the invention. Therefore, so called 'surface mount devices' are included among embodiments.

The scope of embodiments of the invention may also include so called 'through hole mount' devices, having an interconnect structure that may be inserted into a reciprocal interconnect structure, such as a via, in a substrate or in another device. An interconnect structure that may be so inserted may be referred to as a 'pin' or 'wire'. Therefore, embodiments of the invention may include through hole mount devices having an interconnect structure that may be at least one of physically or electrically coupled to an interconnect structure of a substrate or of another device. Because an interconnect structure may be coupled either to or through a surface of a substrate (in the case of the latter, as through a via), we may simply say that an interconnect structure may be coupled to a substrate.

Embodiments of an interconnect structure 302 including solder bumps, solder balls, wires, vias and solder pads may include the use of either solder containing lead, or lead-free solder (solder not containing lead, or containing only trace amounts of lead) as a metallic layer. Numerous embodiments of a lead free metallic layer are further described below.

Figure 4:
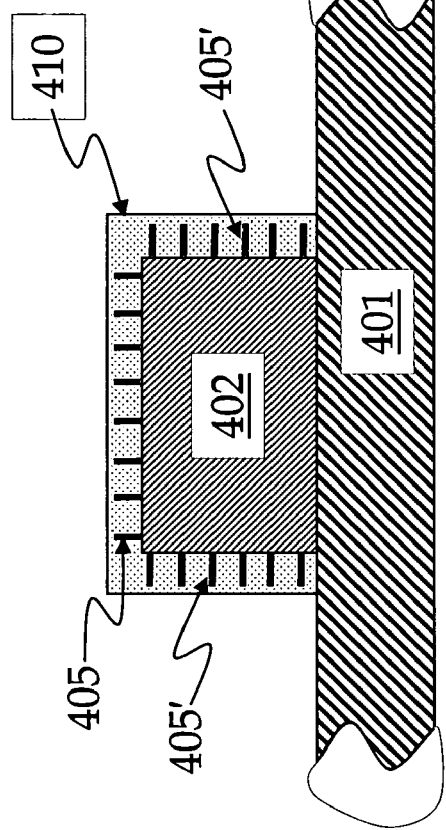
FIG. 4 depicts a cross-sectional view of an interconnect structure wherein nanotubes and a metallic layer are disposed adjacent to the interconnect structure according to an embodiment of the invention.

As depicted in FIG. 3b, a plurality of nanotubes 305 may be disposed adjacent to a surface 304 of an interconnect structure 302, or as in other embodiments, nanotubes 305 may be disposed adjacent to more than one surface 304 of an interconnect structure 302 when the interconnect structure 302 is of a type that has more than one surface. FIG. 4 depicts an interconnect structure 402 disposed adjacent to a substrate 401, with nanotubes 405, 405' disposed adjacent to more than one surface of the interconnect structure 402.

Nanotubes 305 generally have two ends, which, for simplicity of use within this description, may be termed a 'proximate end' and a 'distal end'. In embodiments of the invention, a proximate end of a nanotube 305 may be disposed most closely to an interconnect structure 302, while a distal end may extend generally away from the interconnect structure 302, as depicted in FIG. 3b. While in embodiments, a majority of nanotubes 305 may be disposed as described, with a distal end extending away from the surface of an interconnect structure 302 adjacent to which they are disposed, in other embodiments, a subset of a plurality of nanotubes 305 may be disposed with both ends of each nanotube 305 disposed adjacent to the surface of the interconnect structure 302, and neither end extending away from the interconnect structure 302. Still other embodiments may include nanotubes 305 disposed wherein some nanotubes 305 have only a proximate end disposed adjacent to an interconnect structure 302, while other nanotubes 305 may be disposed with both ends disposed adjacent to the interconnect structure 302.

As indicated in FIG. 1 at 120, embodiments of a method 100 for reinforcing a metallic layer may include disposing a metallic layer adjacent to an interconnect structure. FIG. 3c shows a metallic layer 310 disposed adjacent to an interconnect structure 302 also including nanotubes 305. A metallic layer 310 may be disposed adjacent to only one surface 304 of an interconnect structure 302, or as in the embodiments shown in FIG. 3c and FIG. 4, a metallic layer 310, 410 may be disposed adjacent to more than one surface of the interconnect structure 302, 402. As also shown in FIG. 3c, a metallic layer 310 disposed adjacent to an interconnect structure 302 may also tend to surround and include nanotubes 305 within the metallic layer 310. In embodiments, a metallic layer 310 may not be disposed thickly enough to completely cover the nanotubes 305, while in other embodiments, a metallic layer 310 may be disposed thickly enough to completely cover all or a subset of the plurality of nanotubes 305. Therefore, it may be said that a metallic layer 310 disposed adjacent to a surface of an interconnect structure 302 according to embodiments of the invention may substantially include nanotubes 305 of the plurality of nanotubes 305.

As may be seen in FIGS. 3c-3d, a metallic layer 310 may also be disposed adjacent to a surface 306 of the interconnect structure 302 where nanotubes 305 are not present, as well as a surface 304 adjacent to which nanotubes 305 are present. Likewise, as in FIG. 3d, a metallic layer 310 may be disposed in embodiments adjacent to only a portion of a surface 308 of an interconnect structure 302, and not adjacent to the entire surface, such that a portion of the surface 307 of an interconnect structure 302 may not have a metallic layer disposed adjacent to it.

Figure 2:
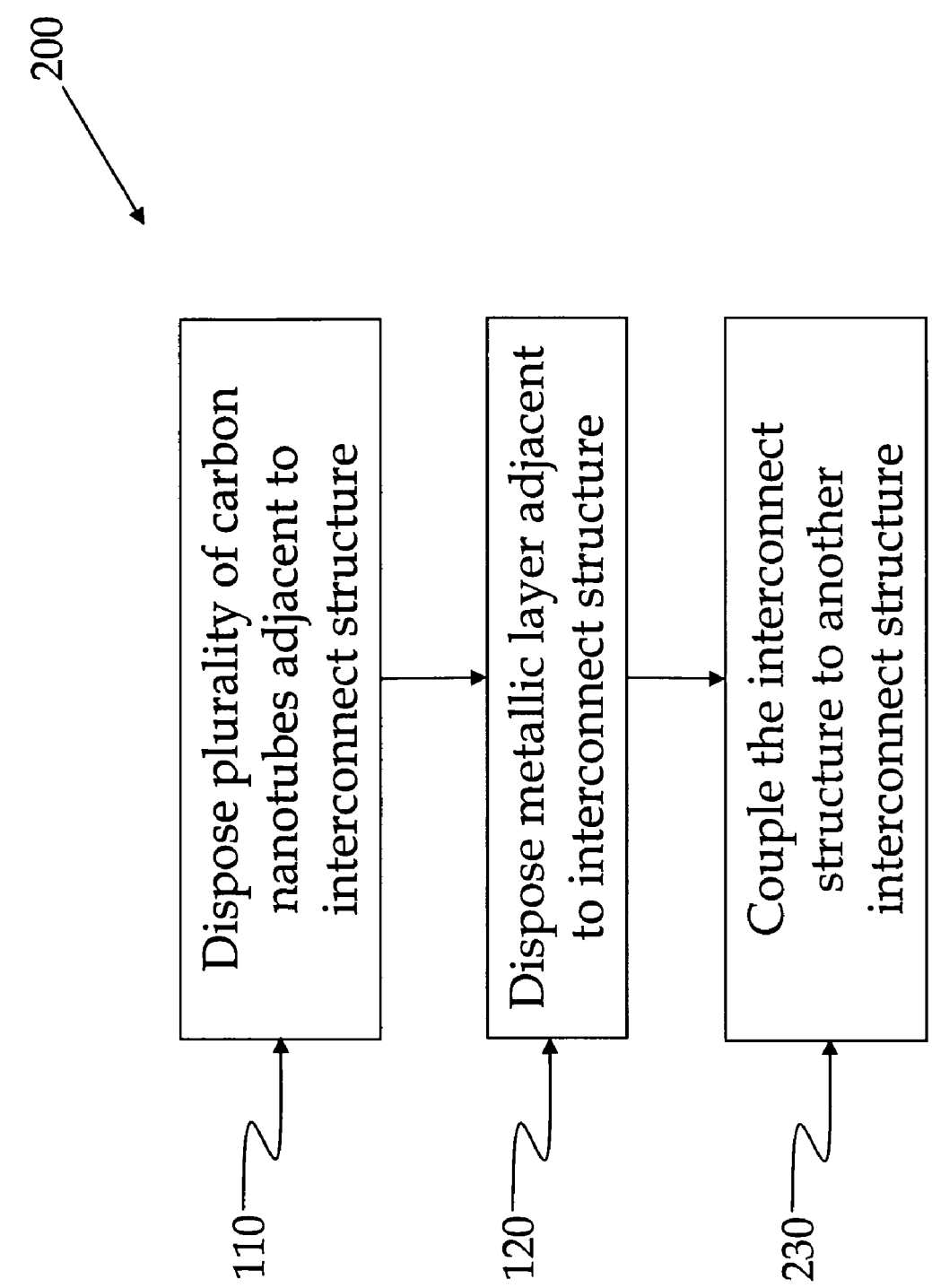
FIG. 2 depicts a block diagram of a method of reinforcing a metallic layer with carbon nanotubes according to an embodiment of the invention.
Figure 6:
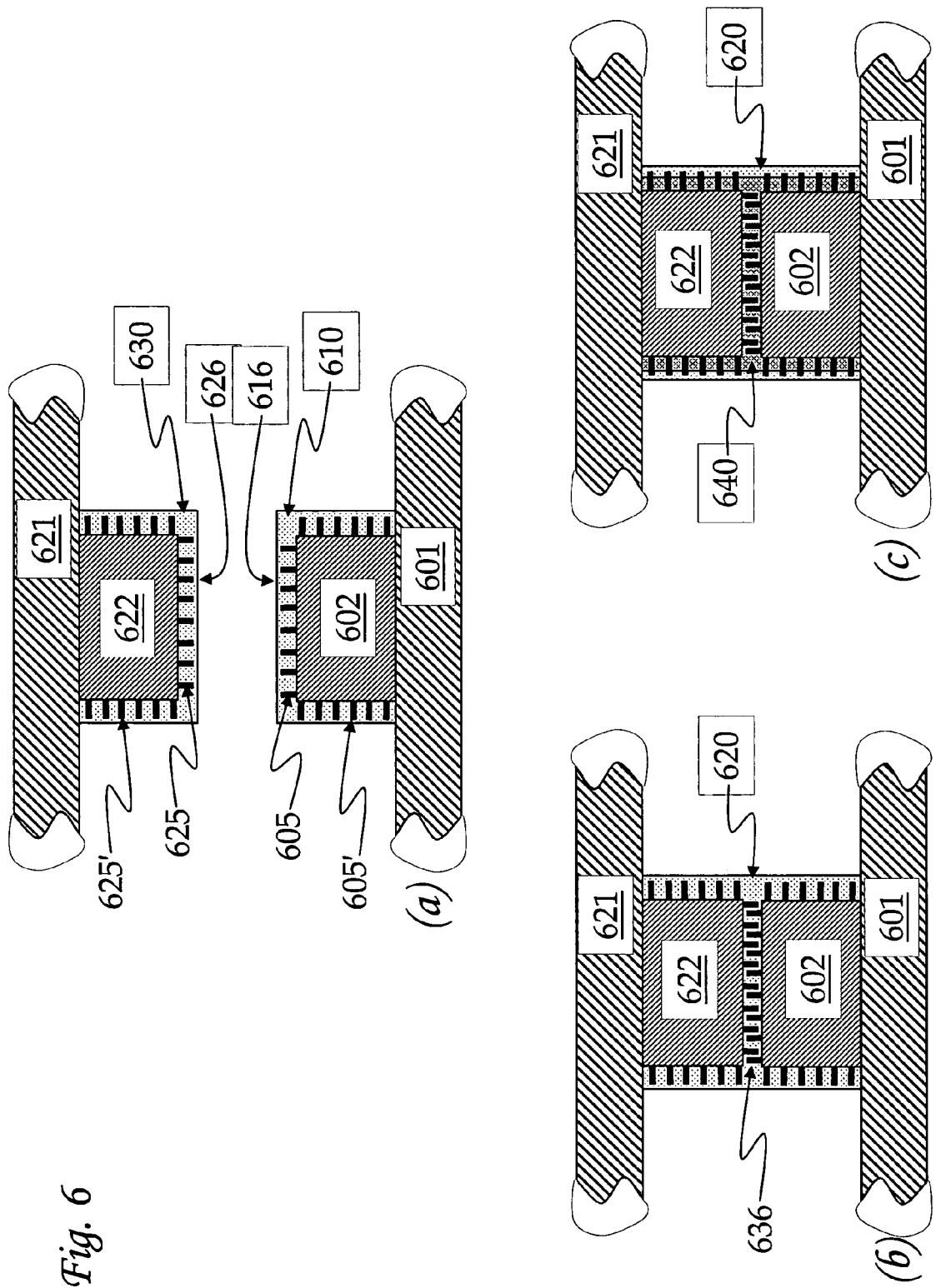
FIGS. 6a-6c depict a sequence of cross-sectional views wherein an interconnect structure and another interconnect structure may be coupled according to embodiments of the invention.

Another embodiment of the invention may further include coupling an interconnect structure to another interconnect structure, as depicted in FIG. 2, at 230. FIG. 6a shows an embodiment in which an interconnect structure 602 is disposed adjacent to a surface of a substrate 601. A plurality of nanotubes 605 are disposed adjacent to a surface of the interconnect structure 602, while another plurality of nanotubes 605' are disposed adjacent to at least another surface of the interconnect structure 602. A metallic layer 610 is also disposed adjacent to a surface of the interconnect structure 602 so as to substantially include a plurality of nanotubes 605, 605'. Another interconnect structure 622 is shown positioned proximate to the interconnect structure 602. In embodiments, interconnect structure 622 may be disposed adjacent to a surface of a substrate 621. In the depicted embodiment, the other interconnect structure 622 similarly possesses a plurality of nanotubes 625, 625', and a metallic layer 630 disposed adjacent to a surface, however, in other embodiments, a plurality of nanotubes 625, 625' or a metallic layer 630 may be absent from the other interconnect, or may be present to some lesser extent as described earlier.

The interconnect structures 602, 622, may have contact surfaces 616, 626, and may be oriented with respect to each other, as shown in FIG. 6a, so that the contact surfaces 616, 626 may be placed closely adjacent to or brought into contact with each other. In embodiments, the interconnect structures 602, 622 may be subjected to elevated temperatures sufficient to cause either or both of the metallic layers 610, 630 to soften and reflow, then may be cooled sufficiently to allow the metallic layers to solidify and form a bond between the interconnect structures 602, 622. Thereby, the interconnect structures 602, 622 may be coupled either physically, or electrically, or both. In an embodiment where both metallic layers 610, 630 reflow, the metallic layers 610, 630 may merge to form a single metallic layer 620, as shown in FIG. 6b, although the composition of the metallic layer 620 may or may not be uniform throughout, as the compositions of the original metallic layers, 610, 630 may or may not have been uniform. In other embodiments, a metallic layer 610 of one interconnect structure 602 may melt, while a metallic layer 630 of another interconnect structure 622 may not melt, or interconnect structure 622 may not have a metallic layer disposed thereon. When the metallic layer 610 then cools and solidifies, it may form a bond with and strongly adhere to the other interconnect structure 622, coupling the interconnect structures 602, 622 either physically, or electrically, or both.

As also shown in FIG. 6b, when the metallic layers melt at the contact surfaces 616, 626 in an embodiment, the nanotubes 605, 625 may extend into an intermediate metallic region 636 formed from the metallic layers 610, 630 at the contact surfaces 616, 626 between the interconnect structures 602, 622. The distal ends of nanotubes 605, 625 may extend sufficiently into the intermediate metallic region 636 that they substantially overlap. In one such embodiment, a distal end of a nanotube 625 may be closer to interconnect structure 602 than is a distal end of a nanotube 605, or a distal end of a nanotube 605 may be closer to interconnect structure 622 than is a distal end of a nanotube 625.

FIG. 6c shows a layer of intermetallic compound (IMC) 640 that may develop due to migration, or 'interdiffusion', of elements across a boundary between a metallic layer 620 and an interconnect structure 602, 622. After a sufficient duration, an entire intermediate metallic layer 636 between coupled interconnect structures 602, 622 may be changed to IMC 640, although, as in the embodiment depicted in FIG. 6c, some amount of unchanged metallic layer 620 may sometimes remain. Intermetallic compounds may be brittle, and may be damaged when subjected to stress from tensile or sheer loads, as may result when materials with different coefficients of thermal expansion (CTE) are subjected to elevated or depressed temperatures. However, in embodiments of the invention, the presence of nanotubes within a layer of IMC may provide substantial resistance to damage due to the relatively high shear strength and tensile strength of nanotubes. Additionally, nanotubes generally conduct electricity with very little resistance, and in embodiments, may provide electrical continuity through an IMC even in the event a crack may partially form in the IMC.

In embodiments, nanotubes may be formed adjacent to a surface of an interconnect structure by first disposing a catalyst adjacent to the surface of the interconnect structure. Catalysts that may be useful in embodiments include metallic catalysts such as nickel, cobalt, palladium, and iron. As nanotubes may be formed on a surface wherever a catalyst is present on the surface, a catalyst may be disposed on a surface only where a user intends to form nanotubes. Therefore, in embodiments, methods may be used whereby a catalyst is selectively disposed adjacent to a surface of an interconnect structure. In other embodiments, a catalyst may be disposed more generally across a surface of an interconnect structure, but then may be removed from those portions where a user does not wish to form nanotubes, leaving catalyst disposed only in those areas where nanotubes are to be formed. This may also be considered 'selectively disposing' the catalyst. According to embodiments, methods such as photolithography, e-beam lithography, shadow masking, soft lithography, and others may be used alone or in combination to dispose a catalyst selectively as described. Each discrete unit or amount of catalyst disposed adjacent to a surface may be referred to as a 'base', and a single nanotube may be formed upon a single base of catalyst. Therefore, a plurality of nanotubes may be formed corresponding to a plurality of bases.

Figure 5:
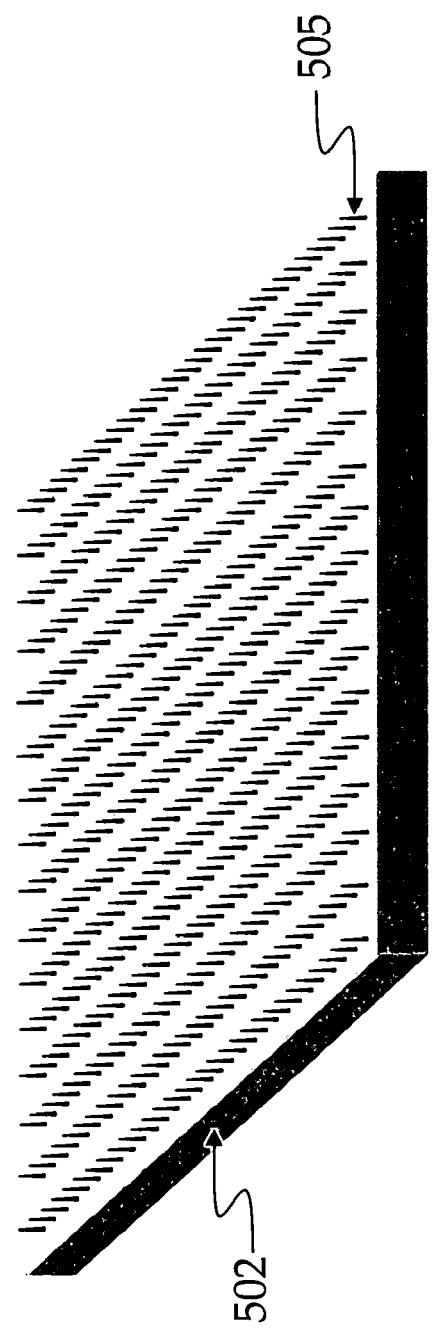
FIG. 5 depicts an oblique view of a plurality of nanotubes disposed adjacent to an interconnect structure according to embodiments of the invention.

Nanotubes may be disposed adjacent to a surface of an interconnect structure in a great number of possible patterns. A catalyst may be disposed so that nanotubes are formed in a generally uniform array. FIG. 5 depicts a plurality of nanotubes 505 disposed adjacent to an interconnect structure 502 in which the nanotubes are arranged in an array, according to an embodiment of the invention. A catalyst may also be disposed more randomly so that nanotubes form in a corresponding random array. Likewise, the density of nanotubes disposed adjacent to a surface of an interconnect structure may vary widely in embodiments of the invention. For simplicity of description, the percentage of area of a surface of an interconnect structure adjacent to which nanotubes may be formed can be described as a 'density' of nanotubes disposed adjacent to the surface. In an embodiment, nanotubes may be formed adjacent to as little as 1% of the surface area of an interconnect structure, whereas in another embodiment, nanotubes may be formed adjacent to as much as 99% of the surface area of an interconnect structure. Embodiments may also include nanotubes formed adjacent to any amount of surface area within this range. Therefore, in embodiments, a density of nanotubes formed adjacent to a surface of an interconnect structure may be between 1% and 99%.

As described, it may also be understood that the density of nanotubes may be controlled by controlling the amount of surface area of an interconnect structure adjacent to which a catalyst is disposed. Likewise, the diameter of each nanotube may be affected by controlling the size of each catalyst base. Relatively small catalyst bases may form nanotubes with relatively small diameters, and relatively larger catalyst bases may likewise form nanotubes with relatively larger diameter. Therefore, controlling the density of nanotubes disposed adjacent to a surface may include controlling at least one of the number of disposed catalyst bases, and the diameter of disposed catalyst bases.

After disposing a catalyst adjacent to a surface of an interconnect structure, nanotubes may be formed in embodiments by at least one of chemical vapor deposition (CVD), plasma enhanced CVD (PECVD), physical vapor deposition (PVD), laser ablation, and arc discharge. For example, well controlled nanotubes may be formed at low temperature using CVD, including decomposing a carbon bearing source (e.g., $C_2H_2/NH_3$ or $CH_4/N_2$ gas mixtures). Additionally, varying the conditions present during nanotube formation may affect the length of nanotubes. Considering CVD as an exemplary embodiment, by varying conditions such as reaction time, reaction temperature, carbon source, or gas pressure, the length of nanotubes may be controlled to form relatively shorter nanotubes or relatively longer nanotubes.

A metallic layer according to embodiments of the invention may be a layer of solder plating, although, embodiments are not limited to only those wherein a metallic layer is disposed by plating method. For example, it may be possible to deposit a metallic layer by sputter deposition, or by laminating a thin metallic layer adjacent to an interconnect structure. However, when plating is used to dispose a metallic layer in embodiments, methods such as chemical plating, electrolytic plating, and dip plating may be used. Each method may have benefits according to individual embodiments. In an exemplary embodiment, chemical plating may be particularly useful for disposing a metallic layer adjacent to small interconnect structures, such as copper bumps measuring only a few hundred microns or less, as there may be no requirement for an external source of electricity for chemical plating.

Embodiments may include a metallic layer formed of an alloy of at least one of tin, bismuth, and indium, combined with at least one of silver, gold, nickel, copper, zinc, aluminum, and magnesium. Alloys formed using tin, bismuth and indium may be a lead-free solder material in embodiments, and may be used rather than a lead-containing solder material, such as a tin-lead alloy. Additionally, alloys formed according to embodiments of the invention may have melting temperatures across a relatively broad range, providing solder materials meeting a broad range of applications and requirements. Therefore, a particular alloy may be chosen based upon the thermal conditions of a manufacturing process, or based upon end use conditions, however, the choice of an alloy may depend on more than one factor alone, and is not limited to only those listed. Nor are thermal conditions the only conditions to be considered, as the physical, electrical, or other factors may also aid a user in selecting an alloy for a particular application.

In embodiments of the invention, and interconnect structure may include at least one of a bulk metal or a surface finish, of at least one of copper, aluminum, nickel, gold, silver, chromium, platinum, and palladium. Therefore, it may also be understood that an interconnect structure could include an alloy of at least copper, aluminum, nickel, gold, silver, chromium, platinum, and palladium. Exemplary embodiments may include a copper pad, a nickel plated ball, or a gold bump, just to name a few. As described regarding metallic layers, such factors as end use conditions, manufacturing conditions, and others may be relevant in selecting a material to be used for an interconnect structure. Such factors are too numerous to provide a complete listing here.

A metallic layer reinforced with nanotubes as described in embodiments may provide a reliable coupling, physically, thermally, or electrically between interconnects as part of an electrical device or a semiconductor device. While these devices describe a number of embodiments, the invention is not so limited. A reinforced metallic layer as described herein may also be used in mechanical devices, for purely mechanical attachment, without departing from the spirit of the invention. In another embodiment, a reinforced metallic layer may be used as a protective coating layer to improve resistance to wear, chipping, flaking, delamination, or other forms of damage that may affect a metallic layer. A metallic layer reinforced with nanotubes may provide for improved electrical conductivity between an interconnect structure and another interconnect structure in embodiments when said structures are electrically coupled, even when the respective interconnect structures are not physically coupled and bonded as by a reflowed metallic layer according to other embodiments. A metallic layer reinforced with nanotubes may also provide for improved thermal conductivity between and interconnect structure and another interconnect structure in embodiments where there is a thermal differential between the two interconnect structures.

Interconnect structures according to embodiments may not be electrical interconnect structures, but may be provided to physical couple one substrate to another. In some such embodiments, it may not be necessary for both substrates to possess interconnect structures, as the interconnect structures of one substrate may be physically coupled directly to the surface of the other substrate, particularly when the surface of the other substrate may include a bulk metal or a metallic layer.

An interconnect structure according to embodiments of the invention may be provided with a metallic layer and a plurality of nanotubes disposed adjacent thereto, for later assembly to a substrate as part of an electrical device (any device employing an electrical current in or for any part of its intended operation or function) or a semiconductor device (any device comprising or including an operable semiconductor material and/or circuit). An interconnect structure according to embodiments may also be included disposed adjacent to a substrate as part of an electrical device or semiconductor device, with a plurality of nanotubes and a metallic layer being later disposed adjacent to the interconnect structure. Therefore, embodiments of the invention are not limited to a particular sequence of including an interconnect structure into a device relative to the disposition of nanotubes and metallic layers adjacent to the interconnect structure.

Figure 7:
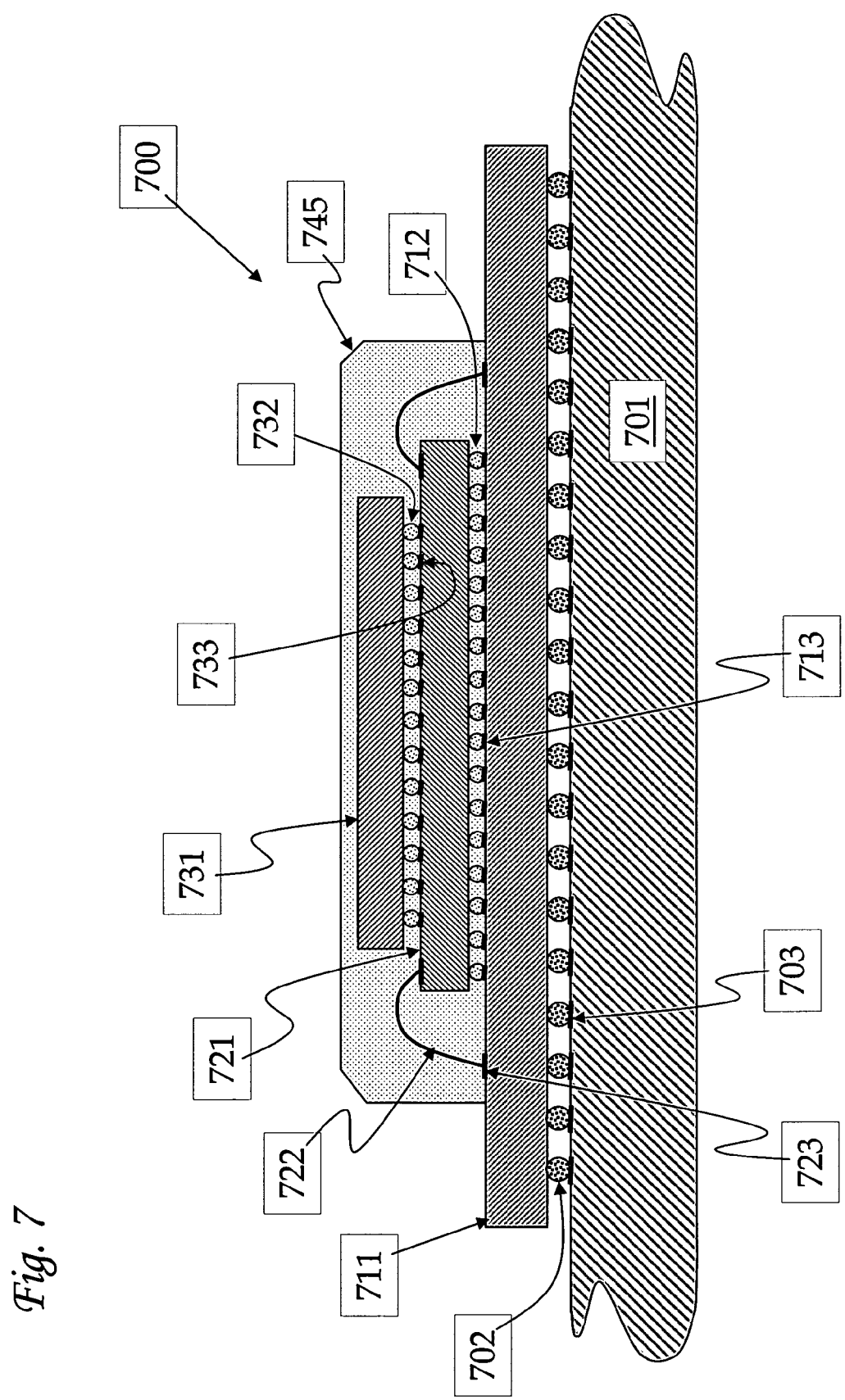
FIG. 7 depicts a cross-sectional view of an assembly including interconnect structures with nanotube reinforced metallic layers according to embodiments of the invention.

FIG. 7 depicts an assembly 700 according to embodiments of the invention. As discussed above, a substrate in embodiments may be a PCB 701, a package substrate 711, or a semiconductor device 721, 731 (as in a stacked package according to an embodiment). An interconnect structure may be a pad 703, 713, 723, 733, a ball 702, 712, 732, or a wire 722. In the depicted assembly, and embodiment is shown wherein an interconnect structure 702 of a package substrate 711 is at least one of electrically and physically coupled to an interconnect structure 703 of a PCB 701. Either or both of interconnect structures 702 and 703 may have disposed thereupon a plurality of nanotubes and a metallic layer, the metallic layer substantially including the nanotubes.

An embodiment is also shown wherein an interconnect structure 712 of a semiconductor device 721 is at least one of electrically and physically coupled to an interconnect structure 713 of a package substrate 711. Either or both of interconnect structures 712 and 713 may have disposed thereupon a plurality of nanotubes and a metallic layer, the metallic layer substantially including the nanotubes. Another embodiment is also shown which is similar to the embodiment just described, except that rather than a ball as an interconnect structure 712, the semiconductor device 721 has as an interconnect structure a wire 722 coupled to another interconnect structure 723 on a package substrate 711.

Another embodiment is shown including a interconnect structure 732 of a semiconductor device 731 at least one of electrically and physically coupled to an interconnect structure 733 of another semiconductor device 721. Either or both of interconnect structures 732 and 733 may have disposed thereupon a plurality of nanotubes and a metallic layer, the metallic layer substantially including the nanotubes. In embodiments including a semiconductor device, the device may include a semiconductor chip such as a silicon chip separated from a wafer where the interconnect structures are disposed adjacent to a surface of the silicon chip, and wherein the silicon chip may not be fully and independently surrounded by a packaging material, such as plastic, ceramic, or others as may be used. In other embodiments, a semiconductor device may be either partially or fully enclosed in a packaging material, and interconnect structures may be formed into or as a part of, or may be affixed to the exterior of the packaging material. For the purposes of this description, a packaged semiconductor device (or 'semiconductor package') or a partially or fully unpackaged semiconductor device are simply referred to as a 'semiconductor device'. As depicted in FIG. 7, a semiconductor package may also include more than one semiconductor device, and the semiconductor devices may collectively be partially or fully surrounded by a packaging material 745.

Accordingly, in embodiments, a semiconductor device may be considered a substrate when, as in FIG. 7, interconnect structures such as 712, 732, 733 may be disposed adjacent to a surface of a semiconductor device. A package substrate 711 may include, in embodiments, a flexible circuit substrate, a rigid PCB, a card (such as a riser card, a memory card, a processor card, a network interface card, a graphics card, and others), or another substrate capable of conveying input/output signals and/or supplying power to a semiconductor device. Embodiments of a substrate as described may also be described as 'circuit substrates', such as integrated circuit substrates or printed circuit substrates.

As may be understood by those with skill in the art, an embodiment of an assembly such as that shown in FIG. 7 may also include other features or structures. For example, an underfill material may be disposed between a semiconductor device and a package substrate, or other components may be disposed adjacent to a package substrate proximate to a semiconductor device. These features have been left out of the figures for clarity and ease of understanding.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

I claim:

1. A method, comprising:
providing a plurality of carbon nanotubes adjacent to a surface of an interconnect structure; and
disposing a metallic layer adjacent to the surface of the interconnect structure, the carbon nanotubes being substantially included within and in direct contact with the metallic layer.

2. The method of claim 1, wherein the nanotubes are single walled carbon nanotubes, multi-walled carbon nanotubes, or a combination thereof.

3. The method of claim 1, wherein a density of carbon nanotubes disposed adjacent to the surface of the interconnect structure is found within a range of 1% to 99%.

4. The method of claim 1, wherein the interconnect structure is at least one selected from the group consisting of a pad, a bump, a wire, a via, and a ball.

5. The method of claim 1, further comprising at least one of physically and electrically coupling the interconnect structure to another interconnect structure.

6. The method of claim 5, wherein the other interconnect structure further comprises a plurality of carbon nanotubes and a metallic layer disposed adjacent to a surface of the other interconnect structure.

7. The method of claim 1, wherein providing carbon nanotubes adjacent to the surface of the interconnect structure comprises disposing a catalyst in a pattern adjacent to the surface of the interconnect structure, the pattern being defined by at least one of photolithography, e-beam lithography, shadow masking, and soft lithography.

8. The method of claim 7, wherein the catalyst includes at least one material selected from the group consisting of nickel, cobalt, palladium, and iron.

9. The method of claim 1, wherein providing carbon nanotubes comprises forming carbon nanotubes by at least one of chemical vapor deposition (CVD), plasma enhanced chemical vapor deposition (PECVD), physical vapor deposition (PVD), laser ablation, and are discharge.

10. The method of claim 1, wherein the metallic layer is disposed by at least one of chemical plating, electrolytic plating, and dip-plating.

11. The method of claim 1, wherein the metallic layer comprises an alloy including at least one material selected from the group consisting of tin, indium, and bismuth, combined with at least one material selected from the group consisting of silver, gold, nickel, copper, zinc, aluminum, and magnesium.

12. The method of claim 1, wherein the interconnect structure comprises at least one material selected from the group consisting of copper, aluminum, nickel, gold, silver, chromium, platinum, and palladium.

13. The method of claim 1, wherein the interconnect structure is an interconnect of at least one of an electrical device and a semiconductor device.

* * * * *